United States Patent
Vakkamäki et al.

(10) Patent No.: US 10,479,646 B2
(45) Date of Patent: Nov. 19, 2019

(54) SOLUTION FOR COMPENSATING AN EFFECT OF TEMPERATURE CHANGE IN A PROXIMITY SENSOR IN A MACHINERY BRAKE OF AN ELEVATOR

(71) Applicant: KONE Corporation, Helsinki (FI)

(72) Inventors: Henri Vakkamäki, Helsinki (FI); Janne Rossi, Helsinki (FI); Timo Korhonen, Helsinki (FI); Zhizhong Yan, Helsinki (FI)

(73) Assignee: KONE CORPORATION, Helsinki (FI)

( * ) Notice: Subject to any disclaimer, the term of this patent is extended or adjusted under 35 U.S.C. 154(b) by 294 days.

(21) Appl. No.: 15/491,472

(22) Filed: Apr. 19, 2017

(65) Prior Publication Data

US 2017/0313549 A1 Nov. 2, 2017

(30) Foreign Application Priority Data

Apr. 28, 2016 (EP) .................................... 16167486

(51) Int. Cl.
| | | |
|---|---|---|
| *B66B 1/36* | (2006.01) | |
| *B66B 1/32* | (2006.01) | |
| *H03K 17/95* | (2006.01) | |

(52) U.S. Cl.
CPC .................. *B66B 1/36* (2013.01); *B66B 1/32* (2013.01); *H03K 17/9502* (2013.01); *H03K 2217/94026* (2013.01); *H03K 2217/96038* (2013.01)

(58) Field of Classification Search
CPC .. B66B 1/36; B66B 1/32; H03K 2217/94026; H03K 2217/9502

USPC ......................................................... 188/161
See application file for complete search history.

(56) References Cited

U.S. PATENT DOCUMENTS

| | | | | |
|---|---|---|---|---|
| 4,618,823 A * | 10/1986 | Dahlheimer | ....... | H03K 17/9505 324/207.16 |
| 4,788,498 A * | 11/1988 | Uemura | ............... | G01D 5/2241 246/187 B |
| 5,322,144 A * | 6/1994 | Skalski | ................... | B66B 7/022 187/393 |
| 6,160,323 A * | 12/2000 | Mayr | ........................ | F16P 3/00 307/116 |
| 6,424,145 B1 * | 7/2002 | Woolsey | ................ | G01B 7/023 324/202 |
| 2002/0100646 A1 * | 8/2002 | Maurice | ................... | B66D 5/14 188/161 |
| 2008/0190710 A1 * | 8/2008 | Shiratsuki | ................ | B66B 5/12 187/393 |

(Continued)

*Primary Examiner* — Thomas J Williams
*Assistant Examiner* — James K Hsiao
(74) *Attorney, Agent, or Firm* — Birch, Stewart, Kolasch & Birch, LLP

(57) ABSTRACT

A machinery brake of an elevator includes a frame part including an electromagnet, an armature part, an inductive proximity sensor indirectly mounted to one of the following: the frame part, the armature part, and a target mounted to another of the following: the frame part, armature part. The machinery brake further includes, for establishing the indirect mounting: a temperature change compensation device mounted between the inductive proximity sensor and one of the following: the frame part, the armature part. Some aspects relate to a method for compensating a change in switching point of an inductive proximity sensor.

11 Claims, 1 Drawing Sheet

(56) References Cited

U.S. PATENT DOCUMENTS

2013/0193985 A1    8/2013   Tillotson
2015/0059854 A1*   3/2015   Shiba .................. H01L 51/4253
                                                                                         136/263

\* cited by examiner

SOLUTION FOR COMPENSATING AN EFFECT OF TEMPERATURE CHANGE IN A PROXIMITY SENSOR IN A MACHINERY BRAKE OF AN ELEVATOR

TECHNICAL FIELD

The invention concerns in general the technical field of elevators. More particularly, the invention concerns a compensation of an effect of temperature change in a machinery brake solutions for elevators.

BACKGROUND

A proximity sensor is a type of sensor that is configured to detect a presence or an absence of a target within an operational area of the sensor. There are different types of proximity sensors available. For example, the operation of the proximity sensors may be based on a capacitance between the sensor and the target or an inductance between the sensor and the target. Further, photoelectric sensors may also be considered as proximity sensors as a reflection of a transmitted light may be monitored and analyzed in order to detect the presence or the absence of the target. Also other types of proximity sensors are known. A selection of the type of proximity sensor is typically dependent on an application area in which the proximity sensor is applied to. More specifically, the selection depends heavily on a material of the target. As an example, if the target is metal an inductive proximity sensor is applicable.

The proximity sensor, and especially the inductive proximity sensor, comprises an inductive coil made of numerous turns of conductive wire, such as copper, and a capacitor for storing electrical charge. An input current is provided to an oscillator that generates an alternating current to the coil, which, in turn, generates a magnetic field in front of the proximity sensor. Now, when a target made of conductive metal is brought in a zone defined by boundaries of the magnetic field, some of the energy is transferred into the target causing eddy currents flowing in the target surface. Thus, the power loss affects to current flow in the internal LC resonance circuit of the proximity sensor, and when the target moves away from the zone at some point the state of the sensor changes. In other words, the sensor may indicate the presence of the target within the magnetic field for example by outputting a signal and when the target moves enough away from the boundaries of the magnetic field, the proximity sensor changes its state and the output signal is not present anymore.

The point at which the proximity sensor changes its state is known as a switching point. The switching points together form a three dimensional surface that defines a layer in space on which the output of the proximity sensor changes its state. Temperature has impact on a position of a switching point within the space. The switching point, and thus the switching point surface, may move farther or closer to the proximity sensor when the temperature of the sensor changes. This may cause problems when the proximity sensor is used in applications where the target movement is small. This is because the temperature change effect to the switching points has big impact to a total design tolerance chain. For example, proximity sensors applied in a hoisting motor brake of elevators is one environment in which the changes in temperature need to be taken into account as the movement of the target, i.e. an actuator, is very small and an allowance for tolerances in the design is tight. Moreover, the temperature may change a lot due to heavy forces applied in the motor.

In addition to the change in a position of the switching point in the proximity sensor the temperature change has also effect to volumes of parts being in the area of temperature change due to thermal expansion. Hence, both elements in the proximity sensor and the target, among any other, may change their volume along the temperature changes. Hence, the thermal expansion and the switching point temperature drift together cause problems especially in application areas wherein the distance between the proximity sensor and the target is small and the temperature may change a lot.

Hence, there is need to develop solution by means of which it is possible, at least partly, to mitigate an effect of temperature change in an application area of the proximity sensor when applied in a machinery brake of an elevator.

SUMMARY

The following presents a simplified summary in order to provide basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

An objective of the invention is to present a machinery brake of an elevator and a method thereto for compensating effect of a temperature change.

Another objective of the invention is that the machinery brake and the method especially compensate at least partly an operational change of a sensor in mounted in the machinery brake due to the temperature change.

The objectives of the invention are reached by a machinery brake of an elevator and a method as defined by the respective independent claims.

According to a first aspect, a machinery brake of an elevator is provided wherein the machinery brake comprises: a frame part comprising an electromagnet; an armature part; and wherein the machinery brake further comprising an inductive proximity sensor indirectly mounted to a one of the following: the frame part, the armature part and a target mounted to another of the following: the frame part, armature part, wherein the machinery brake further comprises, for establishing the indirect mounting: a temperature change compensation device (150) mounted between the inductive proximity sensor and the one of the following: the frame part, the armature part.

The mounting device used in mounting the temperature change compensation device to the corresponding part may deviate from mounting device used in mounting the inductive proximity sensor to the temperature change compensation device. The mounting devices may be screws.

Further, the temperature change compensation device may be configured to be mounted with the mounting devices at top section of the temperature change compensation device in the direction of motion of the frame part and the armature part with respect to each other.

A material of the temperature change compensation device may be such that it expands to an opposite direction with respect to a change in a position of a switching point of the inductive proximity sensor in response to a temperature change. The material of the temperature compensation device may be polyphenylene sulfide doped with graphene when a housing of the inductive proximity sensor is polypropylene doped with graphene.

According to a second aspect, a method for compensating a change in switching point of a proximity sensor due to change in temperature in a machinery brake is provided wherein the method comprises: arranging a temperature change compensation device between the proximity sensor and a one of the following: a frame part of the machinery brake, an armature part of the machinery brake, wherein the material of the temperature change compensation device is such that it expands to an opposite direction with respect to a change in a switching point of the inductive proximity sensor in response to a temperature change.

Various exemplifying and non-limiting embodiments of the invention both as to constructions and to methods of operation, together with additional objects and advantages thereof, will be best understood from the following description of specific exemplifying and non-limiting embodiments when read in connection with the accompanying drawings.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF FIGURES

The embodiments of the invention are illustrated by way of example, and not by way of limitation, in the figures of the accompanying drawings.

DESCRIPTION OF THE EXEMPLIFYING EMBODIMENTS

The specific examples provided in the description given below should not be construed as limiting the scope and/or the applicability of the appended claims.

Lists and groups of examples provided in the description given below are not exhaustive unless otherwise explicitly stated.

Figure 1:
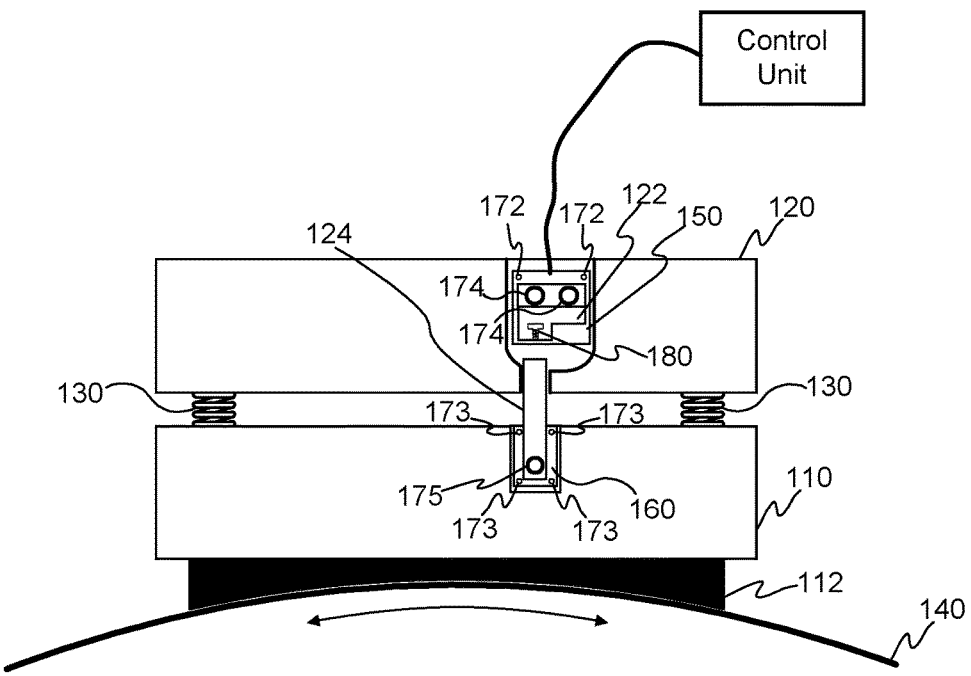
FIG. 1 illustrates schematically an example of an implementation of the present invention.

Next at least some aspects of the invention are described by referring to an inductive proximity sensor implemented in an elevator brake. Such an implementation is disclosed schematically in FIG. 1, wherein a proximity sensor is used for monitoring an operational state of the machinery brake. The machinery brake, as illustrated, comprises an armature part 110, a frame part 120 and a number of springs 130 arranged between the armature part 110 and the frame part 120. The springs may be mounted either to the armature part 110 or the frame part 120 or both. The frame part 120 comprises an electromagnet having a coil and by supplying electric current to the coil of the electromagnet a magnetic field may be generated. As the armature part 110 comprises a core of magnetic material the armature part is pulled towards the frame part 120 when the magnetic field is generated. By dimensioning the springs and the electromagnetic force optimally it is possible to control the triggering of the machinery brake between an active and an inactive state with the current supplied to the electromagnet. Furthermore, a brake pad 112 may be mounted to the armature part 110 which brake pad 112 is arranged to hit against a braking surface of a rotating part of a hoisting machine 140 in order to hold elevator car stationary if the control of the motor is inactivated. According to an embodiment of the present invention an inductive proximity sensor 122 is arranged in an aperture of the frame part 120. The inductive proximity sensor 122 comprises a coil 180 into which an electric current is supplied to in order to generate a magnetic field by means of which it is possible to monitor a position of a target 124 with respect to the proximity sensor 122. The target 124 in this embodiment refers to a metal structure that is mounted, or arranged, to the armature part 110 and that is such in shape that it may intrude to the aperture arranged in the frame part. The target 124, in this embodiment, is arranged to intrude through an aperture hole arranged in the frame part 120 so that it reaches an operational distance of the inductive proximity sensor 122. Naturally, the target 124 and the proximity sensor 122 are dimensioned and arranged so that the proximity sensor arrangement with the target does not prevent the operation of the machinery brake. The proximity sensor 122 may be mounted to the frame part and the armature part with known methods, like using mounting devices, like screws 172, 174, and the mounting of the proximity sensor 122 is performed indirectly as will be described. The mounting of the target 124 is not in a specific focus herein and it may be mounted to the armature part, according to the example, e.g. by using a mounting plate 160 made of steel. The target itself may be mounted, as a non-limiting example, with any mounting mechanism, such as with a screw 175 to the mounting plate 160 which, in turn, may be mounted to the armature part 110 with screws 173, for example. FIG. 1 also illustrates a control unit that is configured to supply current to the proximity sensor, but also to monitor the output of the proximity sensor in order to monitor changes in there.

Figure 2:
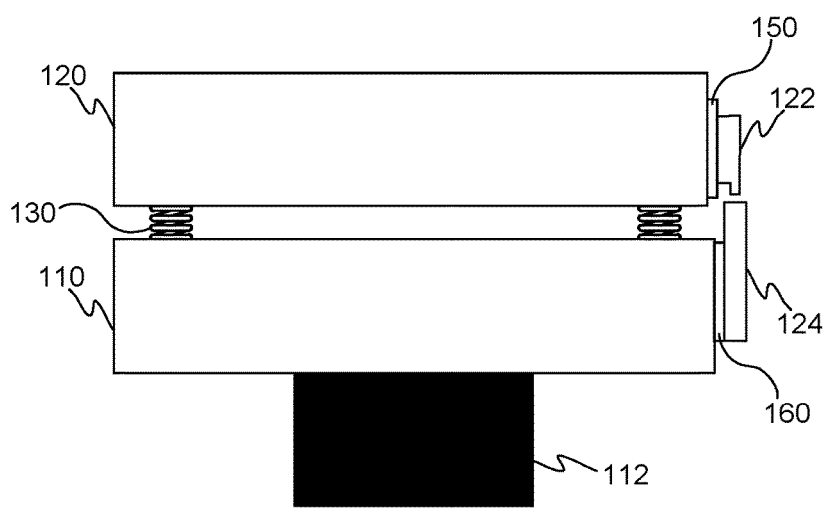
FIG. 2 illustrates schematically another example of an implementation of the present invention.

The FIG. 1 also illustrates a temperature change compensation device 150 that is used for compensating at least part of a change in a position of a switching point of the proximity sensor 122 due to temperature change in the operating environment of the proximity sensor 122. Considering the effect of the temperature change to the proximity sensor 122 one faces at least two sources having effect to the position of the switching point. First of all, the change in temperature causes so called temperature drift of the switching point in the sensor element itself, i.e. in the coil, causing the switching point to drift closer to the inductive proximity sensor 122 when the temperature gets higher and when the temperature gets lower the switching point moves farther from the inductive proximity sensor 122. This is due to an effect of temperature change to an electrical resistance of the coil. Secondly, as the coil 180 resides in a housing forming the proximity sensor 122 the change in temperature also causes thermal expansion of the housing to one direction or another and as a result the switching point of the proximity sensor also moves with respect to the target 124. Especially in application areas, such as in machinery brake, the effect caused by temperature change may have a big impact due to the fact that the actuator movement is small. The actuator in the context of machinery brake shall be considered as the armature part 110 into which the target is mounted in the embodiment as shown in FIG. 2. As the inductive proximity sensor 122 and the target 124 are mutually positioned so that the operational state of the machinery brake may be monitored by utilizing the switching point of the inductive proximity sensor any change in temperature may cause inaccuracy in the monitoring due to the change of the switching point. According to the embodiment of FIG. 1 the temperature change compensation device 150 is arranged in the machinery brake and mounted between the inductive proximity sensor 122 and the part into which the inductive proximity sensor 122 is mounted indirectly through the temperature compensation device 150. The part in the FIG. 1 is the frame part 120 of the machinery brake into which the temperature change compensation device 150 is mounted with screws 172 at the top section of the temperature change compensation device 150. Further, the proximity sensor is mounted with screws 174 to the temperature compensation device 150. The part in which the target 124 is mounted in the example of FIG. 1 is the armature part 110 of the machinery brake The mounting of the temperature change compensation device 150 is advantageously arranged so that it does not limit the thermal expansion, or at least limits it only little. This may be achieved by arranging the screws 172 of the temperature change compensation device 150 horizontally at one end of the device 150, which end in the example of the FIG. 1 is the farther end of the temperature change compensation device 150 from the armature point of view. As a result the thermal expansion may happen, but no deformation of the temperature change compensation device 150 happens, or only a little. The number of mounting devices may vary and be from one screw to a plurality of screws. Fundamentally the idea is to compensate an effect of the temperature change to the switching point with the temperature change compensation device 150 so that the accuracy of the proximity switch may be maintained as closely as possible.

FIG. 2 illustrates schematically a machinery brake from an angle that offers a view to an implementation of the invention according to an embodiment of the invention. In the embodiment of FIG. 2 the proximity sensor 122 is mounted indirectly to the frame part 120 on an outer surface of the frame part 120. The indirect mounting is performed, in the present example, with a temperature change compensation device 150 arranged between the frame part 120 and the inductive proximity sensor 122. The mounting is arranged so that the temperature change compensation device 150 is advantageously mounted directly to the frame parts 110 with one or more mounting devices, such as with screws, and the inductive proximity sensor 122 is directly mounted to the temperature change compensation device 150 with one or more mounting devices, such as with screws. As a result there is no mounting device, such as screw(s), which couples the frame part 120 directly to proximity sensor 122. In this manner the temperature change compensation may be implemented in an optimal way. The mounting devices, i.e. the screws, are not illustrated in FIG. 2 for maintaining clarity. The mounting of the target 124 is not in a specific focus herein. In the example of FIG. 2 the target 124 is mounted with a mounting plate 160 to the armature part 110.

Next it is discussed on the temperature change compensation device. According to the invention the temperature change compensation device 150 for the proximity sensor 122 is a base pad made of applicable material. In order to compensate a change of the switching point of the inductive proximity sensor 122 due to temperature change the temperature change compensation device 150 shall be made of material that expands to an opposite direction with respect to the change in the switching point in accordance to the change in the temperature. In other words if a rise in temperature moves the switching point closer to the proximity sensor 122, the material of the temperature change compensation device 150 shall be selected so that its thermal expansion brings the proximity sensor 122 and the target also closer to each other so that the setup maintains as closely as possible. In this manner the monitoring operation may be held more accurate than without using the temperature change compensation device 150 in the mounting. In order to select an optimal material it is necessary to understand how much the switching point drifts as a function of the temperature. This information is typically available from sensor specifications. With the information it is possible to select the material of the temperature change compensation device 150 so that its thermal expansion direction is opposite to the direction of the change in the switching point. In other words, the aim is to have such material for the temperature change compensation device 150 that compensates, with the thermal expansion, the change in position of the switching point of the sensor as closely as possible, especially within the operating temperature of the elevator's machinery brake, such as within −5 . . . +70 degrees of Celsius. In the selection of the material a thermal expansion coefficient is advantageously used as a parameter because it represents a characteristic of the material indicating its behavior, at least partly, as a function of temperature.

As discussed above the material of the temperature change compensation device 150 shall be selected so that it compensates at least part of the change of the proximity sensor's switching point in response to temperature change. An example of such material is a base pad made of plastic. More specifically, if the housing of the proximity sensor 122 is made of polypropylene comprising 20% graphene, an applicable material for the temperature change compensation device may be polyphenylene sulfide 40% F2-1140 (40% graphene). In other words, the change in the switching point of the proximity sensor 122 is due to a thermal expansion of the housing of the proximity sensor 122, but also comprising some effect due to temperature drift of coil, and the aim is mainly to compensate, at least partly, the total effect with the temperature change compensation device 150.

Concluding the above the present invention may advantageously be implemented so that the temperature change compensation device is made of another plastic material than the sensor housing having the features with respect to each other as described. In some advantageous implementations in elevator's machinery brake the length of the temperature change compensation device mounted under the proximity sensor is optimized with respect to an air gap between the sensor and the target at a nominal temperature. For example, then the nominal switching point may be 0.3 mm that means that an optimal length (vertically) is 21.8 mm+/−0.3 mm. As a result, the ratio between the effect of the temperature change and the length of the temperature change compensation device is 1/73.

The present invention, as described above, is based on an idea to compensate an inductive proximity sensor's switching point change due to temperature change by arranging a temperature change compensation device between the proximity sensor and the part into which the proximity sensor is indirectly mounted to. In some embodiment of the invention a further temperature change compensation device may also be arranged between the actuator (i.e. the target) and the part into which the actuator is indirectly mounted in an elevator's machinery brake installation in order to enhance the disclosed effect achieved with the temperature change compensation device arranged between the proximity sensor and the mounting part. Naturally, in this kind of implementation the total effect of the temperature change compensation devices shall be taken into account in order to achieve a desired result.

As said, the temperature change compensation device mitigates, at least partly, the change in the position of the switching point by thermal expansion, i.e. expanding or contracting, aiming to maintain the switching points, i.e. the switching point surface, as closely as possible in the same position with respect of the proximity sensor and the target. In this manner it is possible to compensate at least part of the effects caused by the temperature change in the environment where the proximity sensor implementation is used.

Some exemplified embodiments of the present invention is described above in a context of such of implementation that the proximity sensor 122 is mounted in the frame part 120 and the target is mounted, or arranged, in the armature part 110 of the machinery brake. However, the inventive idea of the present invention may also be applied in an implementation in which the proximity sensor 122 is mounted in the armature part 110 and the target 124 is mounted in the frame part 120. The temperature change compensation device 150 is mounted at least between the proximity sensor and the armature part in the same manner as described above. Naturally, any need of adjusting the size of the temperature change compensation device shall be taken into account.

The invention is described above in the context of machinery brake of an elevator, wherein mutual distances (i.e. the air gap) of the operating elements are very small. In such an environment there is need to develop solutions which at least partly mitigate any effect due to temperature change.

The specific examples provided in the description given above should not be construed as limiting the applicability and/or the interpretation of the appended claims. Lists and groups of examples provided in the description given above are not exhaustive unless otherwise explicitly stated.

What is claimed is:

1. A machinery brake of an elevator, the machinery brake comprises:
   a frame part comprising an electromagnet;
   an armature part;
   an inductive proximity sensor indirectly mounted to one of the following: the frame part, the armature part; and
   a target mounted to another of the following: the frame part, and the armature part;
   wherein the machinery brake further comprises, for establishing the indirect mounting:
   a temperature change compensation device mounted between the inductive proximity sensor and the one of the following: the frame part, and the armature part.

2. The machinery brake of claim 1, wherein a first mounting device-used in mounting the temperature change compensation device to one of the frame part and the armature part, deviates from a second mounting device used in mounting the inductive proximity sensor to the temperature change compensation device.

3. The machinery brake of the claim 2, wherein the first and second mounting devices are screws.

4. The machinery brake of claim 3, wherein the temperature change compensation device is configured to be mounted with the first and second mounting devices at a top section of the temperature change compensation device.

5. The machinery brake of claim 3, wherein a material of the temperature change compensation device is such that it expands to an opposite direction with respect to a change in a position of a switching point of the inductive proximity sensor in response to a temperature change.

6. The machinery brake of claim 2, wherein the temperature change compensation device is configured to be mounted with the first and second mounting devices at a top section of the temperature change compensation device.

7. The machinery brake of claim 6, wherein a material of the temperature change compensation device is such that it expands to an opposite direction with respect to a change in a position of a switching point of the inductive proximity sensor in response to a temperature change.

8. The machinery brake of claim 2, wherein a material of the temperature change compensation device is such that it expands to an opposite direction with respect to a change in a position of a switching point of the inductive proximity sensor in response to a temperature change.

9. The machinery brake of claim 1, wherein a material of the temperature change compensation device is such that it expands to an opposite direction with respect to a change in a position of a switching point of the inductive proximity sensor in response to a temperature change.

10. The machinery brake of the claim 9, wherein the material of the temperature compensation device is polyphenylene sulfide doped with graphene when a housing of the inductive proximity sensor is polypropylene doped with graphene.

11. A method for compensating a change in switching point of a proximity sensor due to change in temperature in a machinery brake, the method comprises:
   arranging a temperature change compensation device between the proximity sensor and one of the following: a frame part of the machinery brake, an armature part of the machinery brake,
   wherein the material of the temperature change compensation device is such that it expands to an opposite direction with respect to a change in a switching point of the inductive proximity sensor in response to a temperature change.

* * * * *